(12) United States Patent
Wei et al.

(10) Patent No.: US 11,139,398 B2
(45) Date of Patent: Oct. 5, 2021

(54) SEMICONDUCTOR DEVICE AND METHOD FOR FABRICATING THE SAME

(71) Applicant: Taiwan Semiconductor Manufacturing Co., Ltd., Hsinchu (TW)

(72) Inventors: Cheng-Chang Wei, Taipei (TW); Chia-Lin Hsu, Tainan (TW); Hsien-Ming Lee, Changhua (TW); Ji-Cheng Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/865,423

(22) Filed: May 4, 2020

(65) Prior Publication Data
US 2020/0266297 A1    Aug. 20, 2020

Related U.S. Application Data

(63) Continuation of application No. 15/054,080, filed on Feb. 25, 2016, now Pat. No. 10,644,153.

(51) Int. Cl.
*H01L 29/78* (2006.01)
*H01L 27/092* (2006.01)
*H01L 29/66* (2006.01)
*H01L 29/49* (2006.01)
*H01L 27/12* (2006.01)

(52) U.S. Cl.
CPC ...... *H01L 29/7848* (2013.01); *H01L 27/0924* (2013.01); *H01L 29/4966* (2013.01); *H01L 29/66795* (2013.01); *H01L 29/785* (2013.01); *H01L 27/1211* (2013.01)

(58) Field of Classification Search
CPC ..................... H01L 29/66704; H01L 29/7804
See application file for complete search history.

(56) References Cited

U.S. PATENT DOCUMENTS

| | | | | |
|---|---|---|---|---|
| 2012/0132912 A1* | 5/2012 | Suekawa | ............. | H01L 29/7811 257/49 |
| 2013/0249003 A1* | 9/2013 | Oh | ...................... | H01L 27/0924 257/347 |
| 2013/0264652 A1* | 10/2013 | Zhu | ................. | H01L 21/823443 257/369 |

\* cited by examiner

*Primary Examiner* — Raj R Gupta
(74) *Attorney, Agent, or Firm* — JCIPRNET

(57) ABSTRACT

A semiconductor device includes a substrate, a first transistor, and a second transistor. The first transistor is disposed on the substrate within a first region and includes a first gate electrode. The first gate electrode includes a first filter layer between and in contact with a first conductive layer and a second conductive layer. The second transistor is disposed on the substrate within a second region and includes a second gate electrode. The second gate electrode includes a second filter layer between and in contact with a third conductive layer and a fourth conductive layer. The first transistor and the second transistor have a same conductive type, a first threshold voltage of the first transistor is lower than a second threshold voltage of the second transistor, and a first thickness of the first filter layer is larger than a second thickness of the second filter layer.

20 Claims, 10 Drawing Sheets

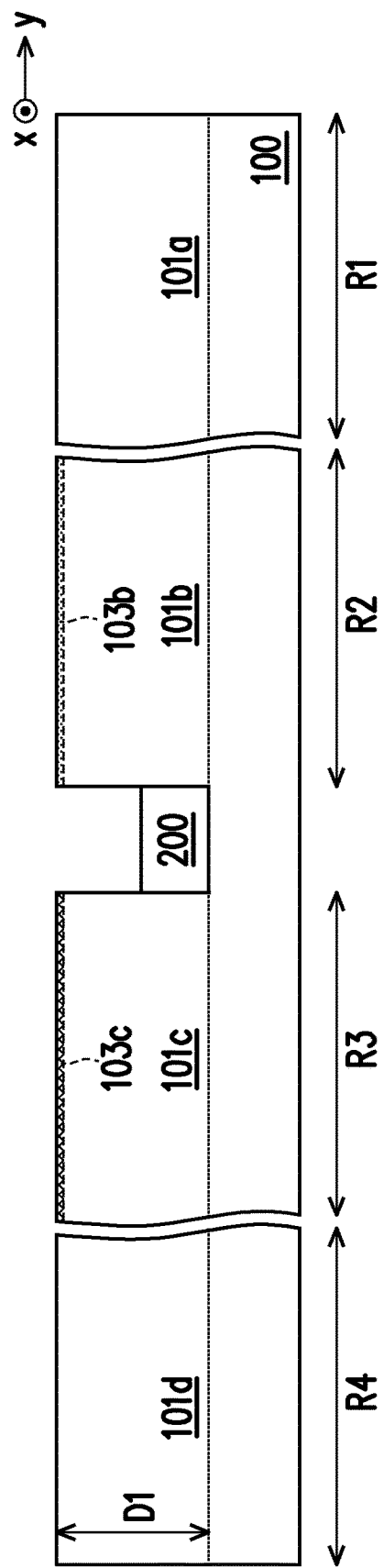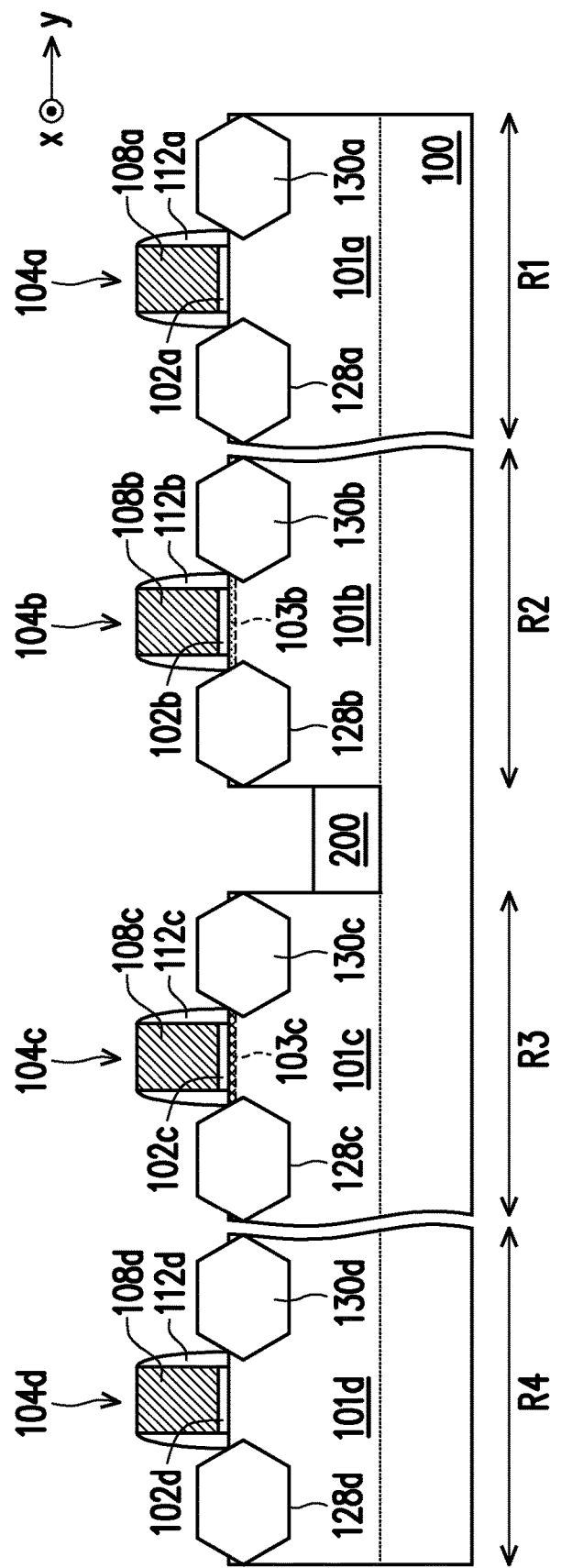

SEMICONDUCTOR DEVICE AND METHOD FOR FABRICATING THE SAME

CROSS-REFERENCE TO RELATED APPLICATION

This application is a continuation application of and claims the priority benefit of a prior application Ser. No. 15/054,080, filed on Feb. 25, 2016, now allowed. The entirety of the above-mentioned patent application is hereby incorporated by reference herein and made a part of this specification.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-type field-effect transistor (FinFET), has been introduced to replace a planar transistor. Although existing FinFET devices and methods of forming FinFET devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A to 2H are cross-sectional views of a method for fabricating a semiconductor device in accordance with some embodiments.

DETAILED DESCRIPTION

Figure 1:
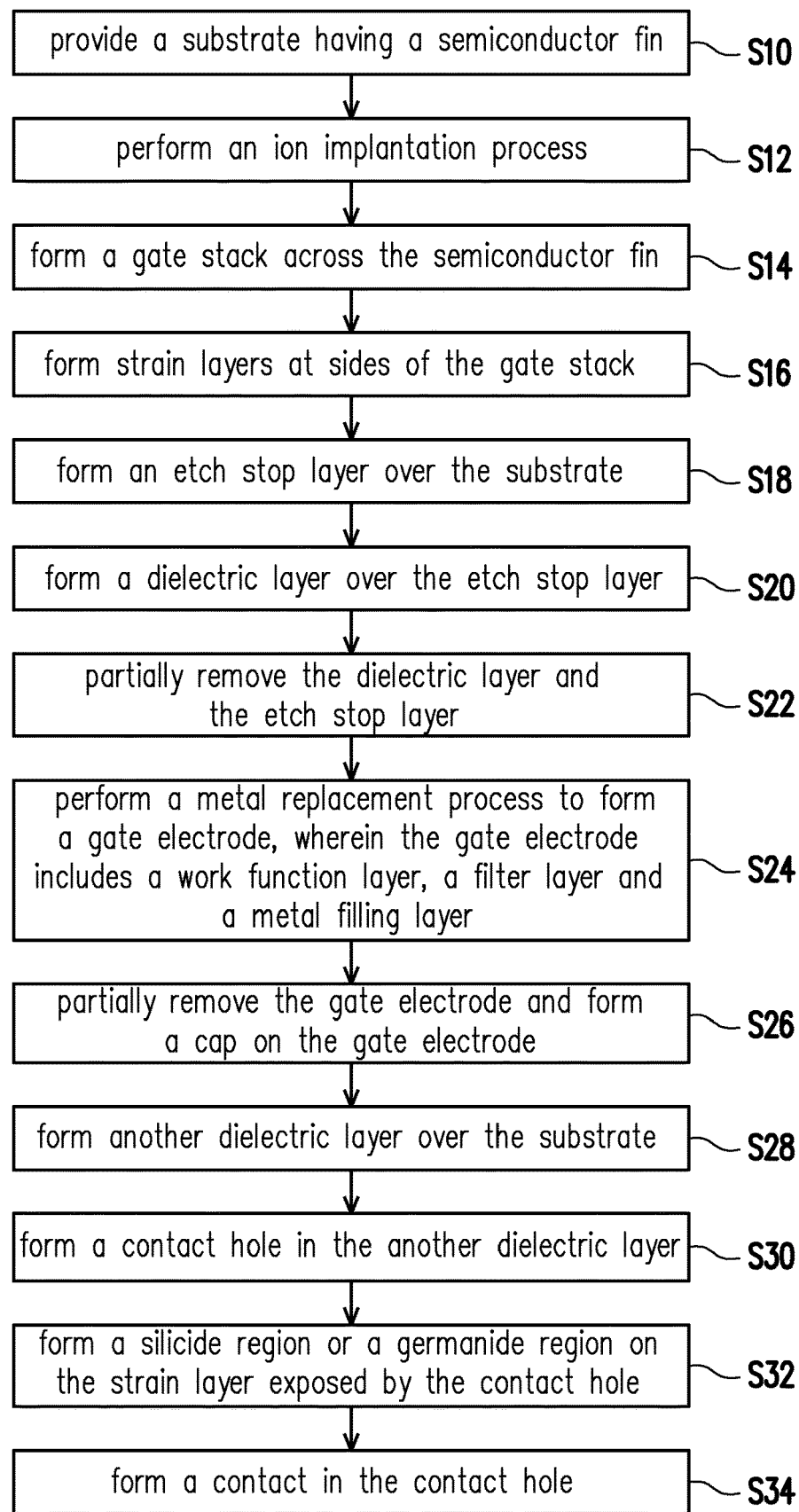
FIG. 1 is a flow chart illustrating a method for fabricating a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow chart illustrating a method for fabricating a semiconductor device in accordance with some embodiments. FIGS. 2A to 2H are cross-sectional views of a method for fabricating a semiconductor device in accordance with some embodiments.

At Step 10 in FIG. 1 and as shown in FIG. 2A, a substrate 100 is provided. The substrate 100 is divided into a region R1, a region R2, a region R3 and a region R4. The region R1 and the region R2 are used for p-type FinFETs with different threshold voltages, and the region R3 and the region R4 are used for n-type FinFETs with different threshold voltages, for example. In some embodiments, the region R1 is used for an ultra low threshold voltage (uLVT) p-type FinFET, the region R2 is used for a standard threshold voltage (SVT) p-type FinFET, the region R3 is used for an SVT n-type FinFET, and the region R4 is used for an uLVT n-type FinFET. The substrate 100 includes a bulk substrate, a silicon-on-insulator (SOI) substrate or a germanium-on-insulator (GOI) substrate, for example. In one embodiment, the substrate 100 includes a crystalline silicon substrate (e.g., wafer). The substrate 100 may include various doped regions (such as well regions) depending on design requirements (e.g., p-type substrate or n-type substrate). The doped regions may be doped with p-type or n-type dopants. For example, the doped regions may be doped with p-type dopants, such as boron or $BF_2^+$, n-type dopants, such as phosphorus or arsenic, and/or a combination thereof. In some embodiments, n-type doped regions may be formed in the region R1 and the region R2, and p-type doped regions may be formed in the region R3 and the region R4. In some alternative embodiments, the substrate 100 may be made of some other suitable elemental semiconductors, such as diamond or germanium, a suitable compound semiconductor, such as gallium arsenide, silicon carbide, indium arsenide, or indium phosphide, or a suitable alloy semiconductor, such as silicon germanium carbide, gallium arsenic phosphide, or gallium indium phosphide. Also, in some embodiments, the substrate may include other conductive layers or other semiconductor elements, such as transistors, diodes or the like.

At Step S10 in FIG. 1 and as shown in FIG. 2A, the substrate 100 has semiconductor fins 101a, 101b, 101c and 101d and isolation structures 200. The semiconductor fins 101a, 101b, 101c and 101d are formed of a material the same as or different from a material of the substrate 100. In some embodiments, a depth D1 of the semiconductor fins 101a, 101b, 101c and 101d ranges from 40 nm to 55 nm. The isolation structures 200 include silicon oxide, silicon nitride, silicon oxynitride, a spin-on dielectric material, a low-k dielectric material, or a combination thereof and formed by performing a high-density-plasma chemical vapor deposition (HDP-CVD) process, a sub-atmospheric CVD (SACVD) process or a spin-on process, for example.

As shown in FIG. 2A, in some embodiments, the semiconductor fins 101a, 101b, 101c and 101d are formed by forming trenches, forming shallow trench isolation (STI) regions in the trenches, and lowering a top surface of the STI regions by performing an etching process to a level lower than an original top surface of the substrate 100. The remaining portions of the STI regions become the isolation structures 200, and the remaining portions of the substrate 100 between the isolation structures 200 thus become the semiconductor fins 101a, 101b, 101c and 101d. Top surfaces of the isolation structures 200 are lower than top surfaces of the semiconductor fins 101a, 101b, 101c and 101d. In other words, top portions 110 of the semiconductor fins 101a, 101b, 101c and 101d protrude from the top surfaces 200a of the isolation structures 200.

In some other embodiments, the semiconductor fins 101a, 101b, 101c and 101d are formed of a material different from a material of the substrate 100. The semiconductor fins 101a, 101b, 101c and 101d may be formed by lowering top portions of the substrate 100 between the adjacent isolation structures 200 to form recesses, and re-growing a semiconductor material different from the material of the substrate 100 in the recesses. Top portions of the STI regions may then be removed by performing a chemical mechanical polish process and an etching process, while bottom portions of the STI regions are not removed. As a result, the remaining portions of STI regions become the isolation structures 200, and top portions of the re-grown semiconductor material between the adjacent isolation structures 200 become the semiconductor fins 101a, 101b, 101c and 101d.

At Step S12 in FIG. 1 and as shown in FIG. 2A, ion implantation processes are performed to form doped regions in surfaces of the semiconductor fins so as to adjust or set threshold voltage values of the uLVT p-type FinFET, the SVT p-type FinFET, the SVT n-type FinFET or/and the uLVT n-type FinFET to be formed. In some embodiments, the ion implantation processes include a first implantation process and a second implantation process. The first implantation process is performed to form a doped region 103c in a surface of the semiconductor fin 101c, and a second implantation process is performed so as to form a doped region 103b in a surface of the semiconductor fin 101b. In some embodiments, the doped region 103c is doped with n-type dopants, such as phosphorus or arsenic, and the doped region 103b is doped with p-type dopants, such as boron or $BF_2^+$.

In other words, the threshold voltage value of the SVT n-type FinFET to be formed in the region R3 is adjusted by performing the first implantation process first, and the threshold voltage value of the SVT p-type FinFET to be formed in the region R2 is also adjusted by performing the second implantation process first. The threshold voltage values of the uLVT p-type FinFET, the SVT p-type FinFET, the SVT n-type FinFET and the uLVT n-type FinFET may be further adjusted by the follow-up processes.

At Step S14 in FIG. 1 and as shown in FIG. 2B, gate stacks 104a, 104b, 104c and 104d are formed across the semiconductor fins 101a, 101b, 101c and 101d respectively. In one embodiment, an extending direction X of the gate stacks 104a, 104b, 104c and 104d is, for example, perpendicular to an extension direction Y of the semiconductor fins 101a, 101b, 101c and 101d, so as to cover middle portions of the semiconductor fins 101a, 101b, 101c and 101d. In some embodiments, the gate stack 104a includes a gate dielectric layer 102a and a gate electrode 108a. Similarly, the gate stack 104b includes a gate dielectric layer 102b and a gate electrode 108b, the gate stack 104c includes a gate dielectric layer 102c and a gate electrode 108c, and the gate stack 104d includes a gate dielectric layer 102d and a gate electrode 108d. In alternative embodiments, the gate stacks 104a, 104b, 104c and 104d further include spacers 112a, 112b, 112c, and 112d respectively.

In alternative embodiments, the gate stack 104a, 104b, 104c or 104d may further include interfacial layers (ILs) on the semiconductor fin 101a, 101b, 101c or 101d. In other words, the gate dielectric layer 102a, 102b, 102c or 102d is formed between the IL and the gate electrode 108a, 108b, 108c or 108d respectively. In some embodiments, the IL includes a dielectric material, such as silicon oxide or silicon oxynitride. The IL is formed by performing a thermal oxidation process, a chemical vapor deposition (CVD) process, or an atomic layer deposition (ALD) process. It should be noted that the detail described below with respect to the elements of the gate stacks 104a may also apply to the elements of the gate stacks 104b, 104c and 104d, and thus the description of the elements in the gate stacks 104b, 104c and 104d are omitted.

The gate dielectric layer 102a is formed to cover portions of the semiconductor fins 101a. In some embodiments, the gate dielectric layer 102a includes silicon oxide, silicon nitride, silicon oxynitride, high-k dielectric materials, or a combination thereof. The high-k dielectric materials are generally dielectric materials with a dielectric constant higher than 4. The high-k dielectric materials include metal oxide. In some embodiments, examples of the metal oxide used as the high-k dielectric materials include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, or a combination thereof. The gate dielectric layer 102a is formed by performing a thermal oxidation process, a CVD process, an ALD process, or a combination thereof.

The gate electrode 108a is formed on the gate dielectric layer 102a. In some embodiment, the gate electrode 108a serves as dummy gate electrode, and the gate electrode 108a is made of polysilicon. A metal gate (also referred to as "replacement gates") may replace the dummy gate electrode in subsequent steps. The replacing step will be discussed in greater detail in subsequent paragraphs.

Lightly doped source and drain (LDD) regions (not shown) are formed in the semiconductor fins 101a, 101b, 101c and 101d. The LDD regions are formed by performing an ion implantation process, for example. In some embodiments, the semiconductor fins 101a and 101b in the region R1 and region R2 are doped with p-type dopants, and the semiconductor fins 101c and 101d in the region R3 and region R4 are doped with n-type dopants.

As shown in FIG. 2B, the spacers 112a are formed over sidewalls of the gate electrode 108a. The spacers 112a are formed of silicon oxide, silicon nitride, silicon oxynitride, silicon carbide, SiCN, fluoride-doped silicate glass (FSG), low-k dielectric materials (such as or SiCON), or a combination thereof. It should be noted that the low-k dielectric materials are generally dielectric materials having a dielectric constant lower than 3.9. The spacers 112a may have a multi-layer structure including one or more liner layers. The liner layer includes a dielectric material such as silicon oxide, silicon nitride, and/or other suitable materials. The formation of the spacers 112a can be achieved by depositing a suitable dielectric material and anisotropically etching off the dielectric material.

As shown in FIG. 2B, recesses 128a, 128b, 128c and 128d are formed within the semiconductor fin 101a, 101b, 101c and 101d beside the gate stacks 104a, 104b, 104c and 104d by removing a portion of the semiconductor fins 101a, 101b, 101c and 101d at locations intended for source and drain regions. In some embodiments, the formation of the recesses 128a, 128b, 128c and 128d includes performing a first etching process and a second etching process. Here, the first etching process refers to a trench etching process such as an anisotropic etching process, and the second etching process refers to a lateral etching process such as an isotropic etching process.

At Step S16 in FIG. 1 and as shown in FIG. 2B, strain layers 130a and 130b are formed in recesses 128a and 128b of the semiconductor fin 101a and 101b in the region R1 and the region R2 respectively. The strain layers 130a and 130b are formed at sides of the gate stacks 104a and 104b respectively. Lattice constants of the strain layers 130a and 130b are different from a lattice constant of the substrate 100, and portions of the semiconductor fins 101a and 101b covered by the gate stacks 104a and 104b are strained or stressed to enhance carrier mobility and performance of the FinFETs. In one embodiment, the strain layers 130a and 130b, such as SiGe, are utilized for electron mobility enhancement of the uLVT p-type FinFET and the SVT p-type FinFET to be formed in the region R1 and the region R2 respectively.

In addition, strain layers 130c and 130d are formed in the semiconductor fins 101c and 101d in the region R3 and the region R4. Lattice constants of the strain layers 130c and 130d are different from the lattice constant of the substrate 100, and portions of the semiconductor fins 101c and 101d covered by the gate stack 104c and 104d are strained or stressed to enhance the carrier mobility and performance of the FinFETs. In one embodiment, the strain layers 130b such as SiC or SiP, are utilized for electron mobility enhancement of the SVT n-type FinFET and the uLVT n-type FinFET to be formed in the region R3 and the region R4 respectively.

In some embodiments, the strain layers 130a, 130b, 130c and 130d are formed through epitaxial growth. In some embodiments, the epitaxial growth technology includes performing a low pressure CVD (LPCVD) process, an atomic layer CVD (ALCVD) process, an ultrahigh vacuum CVD (UHVCVD) process, a reduced pressure CVD (RPCVD) process, a molecular beam epitaxy (MBE) process, a metalorganic vapor phase epitaxy (MOVPE) process or a combination thereof. Alternatively, the epitaxial growth technology utilizes a cyclic deposition-etch (CDE) epitaxy process or a selective epitaxial growth (SEG) process to form the strained material of high crystal quality. In some embodiments, a material of the strain layers 130a and 130b includes a p-type dopant (such as boron or $BF_2^+$) doped therein formed through selective epitaxial growth by performing in-situ doping, and a material of the strain layers 130c and 130d includes an n-type dopant (such as phosphorus or arsenic) doped therein formed through selective epitaxial growth by performing in-situ doping.

Figure 2C:
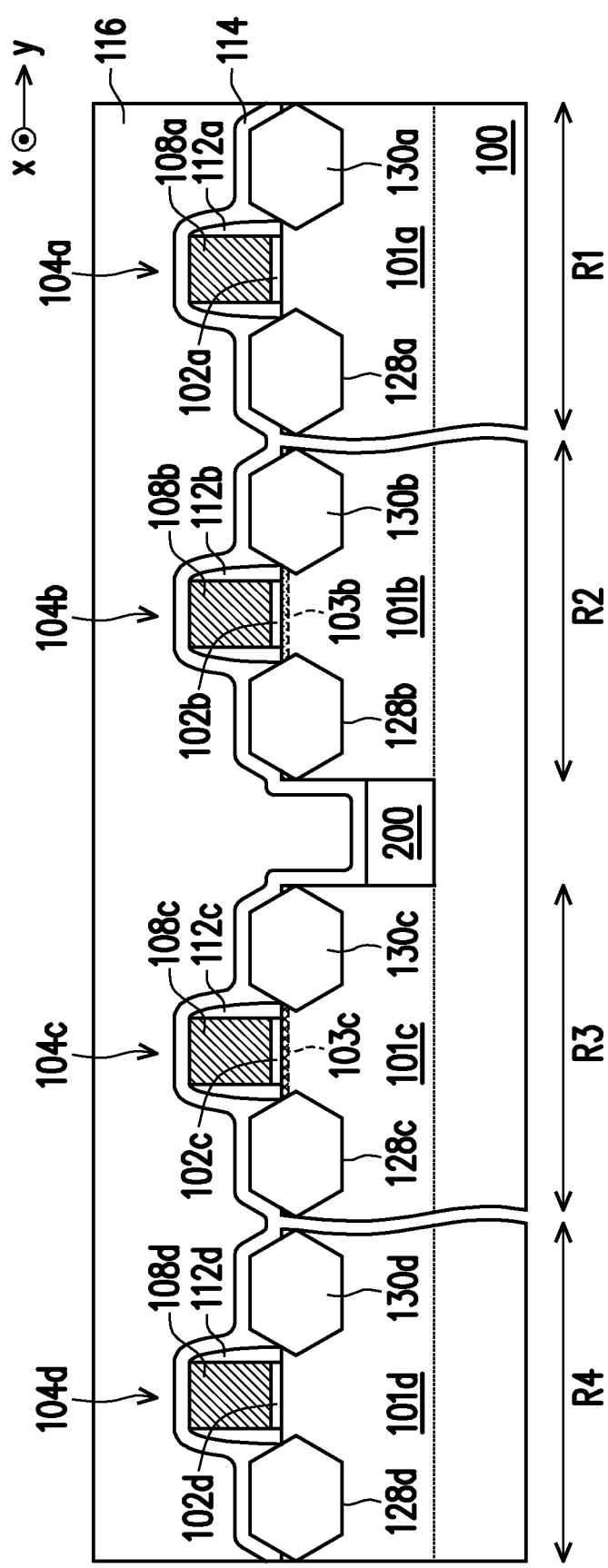

At Step S18 in FIG. 1 and as shown in FIG. 2C, an etch stop layer 114 is formed over the substrate 100. In some embodiments, the etch stop layer 114 may be referred to as a contact etch stop layer (CESL). The etch stop layer 114 includes silicon nitride, carbon-doped silicon nitride, or a combination thereof. In some embodiments, the etch stop layer 114 is deposited by performing a CVD process, a high density plasma (HDP) CVD process, a sub-atmospheric CVD (SACVD) process, a molecular layer deposition (MLD) process, or other suitable processes. In some embodiments, before the etch stop layer 114 is formed, a buffer layer (not shown) may be formed over the substrate 100. In an embodiment, the buffer layer is an oxide such as silicon oxide. However, other compositions may be possible. In some embodiments, the buffer layer is deposited by performing a CVD process, a HDPCVD process, a SACVD process, an MLD process, or other suitable processes.

At Step S20 in FIG. 1 and as shown in FIG. 2C, a dielectric layer 116 is formed over the etch stop layer 114. In some embodiments, the dielectric layer 116 may be referred to as an interlayer dielectric layer (ILD). The dielectric layer 116 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some other embodiments, the dielectric layer 116 includes low-k dielectric materials. It should be noted that the low-k dielectric materials are generally dielectric materials having a dielectric constant lower than 3.9. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. It is understood that the dielectric layer 116 may include one or more dielectric materials and/or one or more dielectric layers. In some embodiments, the dielectric layer 116 is formed to have a suitable thickness by performing a flowable CVD (FCVD) process, a CVD process, a HDPCVD process, a SACVD process, a spin-on process, a sputtering process, or other suitable processes.

Figure 2D:
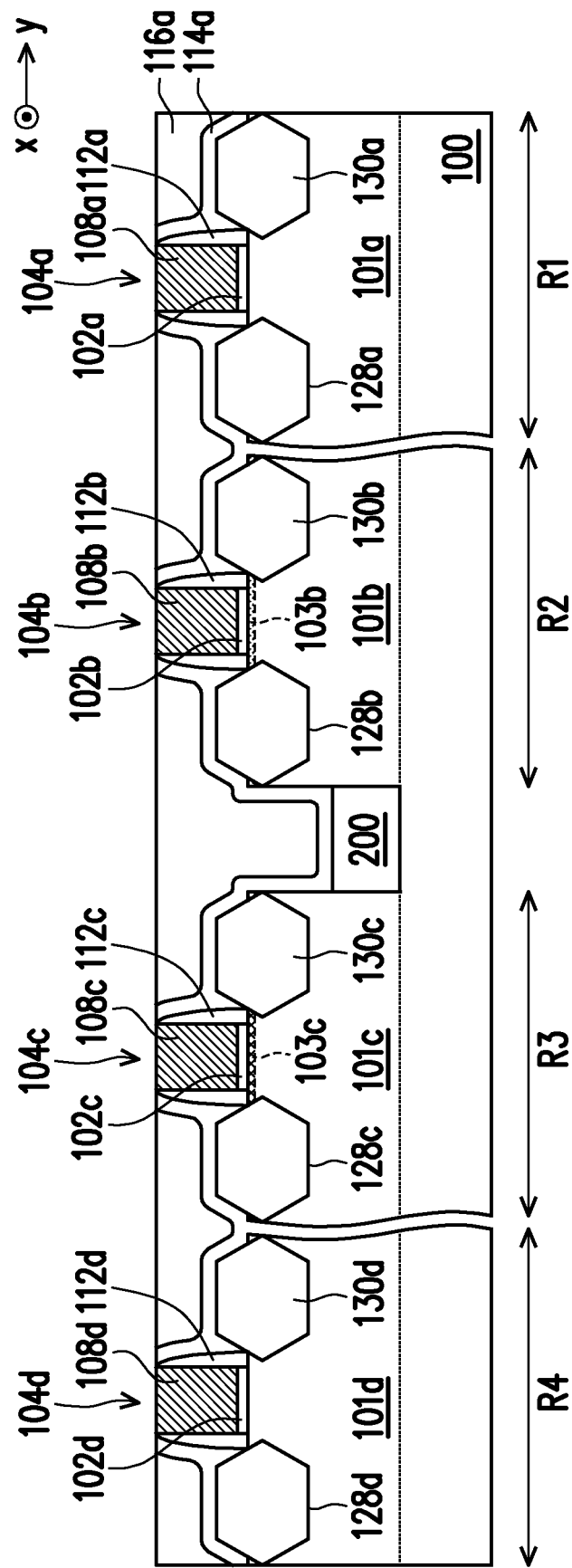

At Step S22 in FIG. 1 and as shown in FIG. 2D, the dielectric layer 116 and the etch stop layer 114 are partially removed such that top surfaces of the gate stacks 104a, 104b, 104c and 104d are exposed, and a dielectric layer 116a and an etch stop layer 114a are formed. The process of removing a portion of the dielectric layer 116 and a portion of the etch stop layer 114 is achieved by a chemical mechanical polishing (CMP) process, an etching process, or other suitable processes.

Figure 2E:
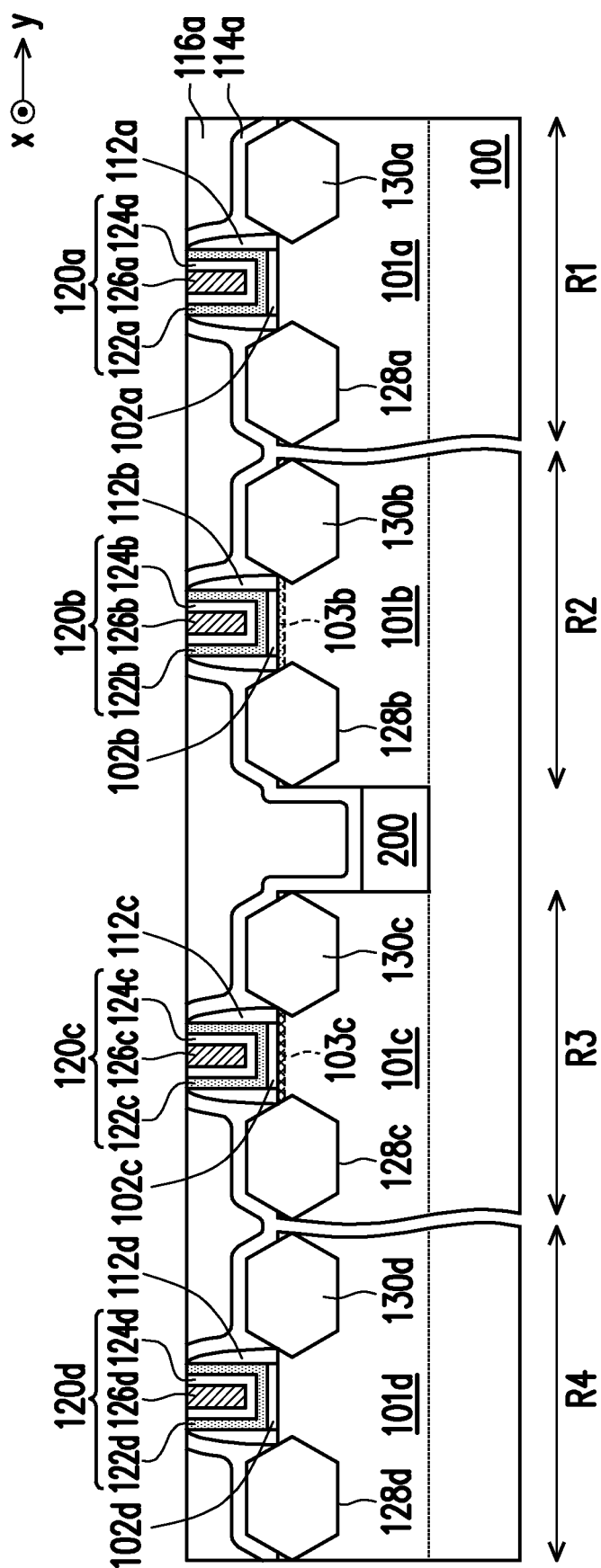

At Step S24 in FIG. 1 and as shown in FIGS. 2D and 2E, a metal replacement process is performed. In some embodiments, the gate electrodes 108a, 108b, 108c and 108d are dummy gate electrodes, and are replaced respectively by gate electrodes 120a, 120b, 120c and 120d. Specifically, materials of the gate electrodes 108a, 108b, 108c and 108d are polysilicon and the materials of the gate electrodes 120a, 120b, 120c and 120d include metal-containing conductive layers. At least one of the metal-containing conductive layers includes a barrier, a work function layer, a seed layer, an adhesion layer, a barrier layer, a filter layer, a metal filling layer or a combination thereof. The metal-containing conductive layers include Al, Cu, W, Ti, Ta, Ag, Ru, Mn, Zr, TiAl, TiN, TaN, WN, TiAlN, TaN, TaC, TaCN, TaSiN, NiSi, CoSi, or a combination thereof, for example. The metal-containing conductive layers are formed by forming metal-containing conductive material layers, and a chemical mechanical polishing (CMP) process, an etching process, or other suitable processes.

In some embodiments, the gate electrode 120a includes a work function layer 122a, a filter layer 124a and a metal filling layer 126a for the uLVT p-type FinFET, and the gate electrode 120b includes a work function layer 122b, a filter layer 124b and a metal filling layer 126b for the SVT p-type FinFET. Similarly, the gate electrode 120c includes a work function layer 122c, a filter layer 124c and a metal filling layer 126c for the SVT n-type FinFET, and the gate electrode 120d includes a work function layer 122d, a filter layer 124d and a metal filling layer 126d for the uLVT n-type FinFET.

In some embodiments, materials of the work function layers 122a and 122b are the same, and include TiN, WN, TaN, Ru, or a combination thereof. Materials of the work function layers 122c and 122d are the same, and include Ti, Ag, Al, TiAl, TiAlN, TaC, TaCN, TaSiN, Mn, Zr, or a combination thereof. The work function layers 122a, 122b, 122c and 122d may be formed by performing a suitable process such as an ALD process, a CVD process, a PVD process, a plating process, or a combination thereof. Thicknesses of the work function layer 122a, 122b, 122c, and 122d are in a range from 30 angstroms to 50 angstroms. Materials of the metal filling layers 126a, 126b, 126c and 126d include tungsten (W). The metal filling layers 126a, 126b, 126c and 126d may be formed by performing a suitable process such as an ALD process, a CVD process, a PVD process, a plating process, or a combination thereof.

The filter layer 124a is formed between the metal filling layer 126a and the work function layer 122a. In some embodiments, the filter layer 124a is formed to avoid or decrease penetration of diffusion atoms (such as W, F or O) from the work function layer 122 to the metal filling layer 126a, or from the metal filling layer 126a to the work function layer 122a. The diffusion atoms include metal atoms (such as W) derived from the metal filling layer 126a and diffusing into the work function layer 122a, or residues (such as F or O) derived from a precursor of the metal filling layer 126a or the work function layer 122a (be oxidized). As a result, the issue of threshold voltage shift may be prevented or decreased. Similarly, the filter layer 124b is disposed between the metal filling layer 126b and the work function layer 122b, the filter layer 124c is disposed between the metal filling layer 126c and the work function layer 122c, and the filter layer 124d is disposed between the metal filling layer 126d and the work function layer 122d. The filter layers 124b, 124c and 124d are also formed to prevent or decrease the diffusion of the diffusion atoms.

In some embodiments, a material of the filter layer 124a is the same as a material of the filter layer 124b, and a material of the filter layer 124c is the same as a material of the filter layer 124d. Furthermore, in alternative embodiments, the materials of the filter layers 124a, 124b, 124c and 124d are the same. In alternative embodiments, the materials of the filter layers 124a, 124b, 124c and 124d are the same, and the materials of the work function layers 122a and 122b are the same as the materials of the filter layers 124a, 124b, 124c and 124d, whereas the materials of the work function layers 122c and 122d are different from the materials of the filter layers 124a, 124b, 124c and 124d.

In some embodiments, the materials of the filter layers 124a, 124b, 124c and 124d are the same, and the materials of the work function layer 122a and 122b are the same as the materials of the filter layers 124a, 124b, 124c and 124d, whereas the materials of the work function layers 122c and 122d are different from the materials of the filter layers 124a, 124b, 124c and 124d. Furthermore, the materials of the filter layers 124a, 124b, 124c and 124d are selected from a material that results in little or no variation of threshold voltages of the uLVT p-type FinFET and the SVT p-type FinFET, but results in decrease/increase of threshold voltages of the SVT n-type FinFET and the uLVT n-type FinFET when thicknesses of the filter layers 124a, 124b, 124c and 124d are increased/decreased. In other words, the materials of the filter layers 124a, 124b, 124c and 124d are selected from a material such that the extent of decreases in threshold voltages of the SVT n-type FinFET and the uLVT n-type FinFET are more than the extent of decreases/increases in the threshold voltage values of the uLVT p-type FinFET and the SVT p-type FinFET when the thicknesses of the filter layer 124a, 124b, 124c and 124d are increased/decreased.

In alternative embodiments, the materials of the filter layers 124a, 124b, 124c and 124d are the same, and the materials of the work function layers 122a and 122b are the same as the materials of the filter layers 124a, 124b, 124c and 124d, whereas the materials of the work function layers 122c and 122d are different from the materials of the filter layers 124a, 124b, 124c and 124d. The materials of the filter layers 124a, 124b, 124c and 124d are selected from a material such that the threshold voltage values of the SVT n-type FinFET and the uLVT n-type FinFET are decreased/increased and the threshold voltage values of the uLVT p-type FinFET and the SVT p-type FinFET are increased/decreased when a temperature of a thermal process performed after the formation of the filter layers 124a, 124b, 124c and 124d are increased/decreased. The temperature of the thermal process is in a range from 600° C. to 650° C., for example. The thermal process may be any thermal process performed after the formation of the filter layers 124a, 124b, 124c and 124d. In some embodiments, the thermal process may be a step of a self-aligned silicide process or a step of a self-aligned germanide process. Alternatively, the thermal process is performed after a self-aligned silicide process or a self-aligned germanide process.

In some embodiments, the materials of the filter layers 124a, 124b, 124c and 124d include a metal nitride (such as TiN), or a composite containing metal nitride (such as TiN—$Si_3N_4$ composite, TSN). The filter layers 124a, 124b, 124c and 124d may be formed by performing a suitable process such as an ALD process, a CVD process, a PVD process, a plating process, or a combination thereof. The thicknesses of the filter layers 124a, 124b, 124c and 124d are in a range form 10 angstroms to 30 angstroms.

Figure 2F:
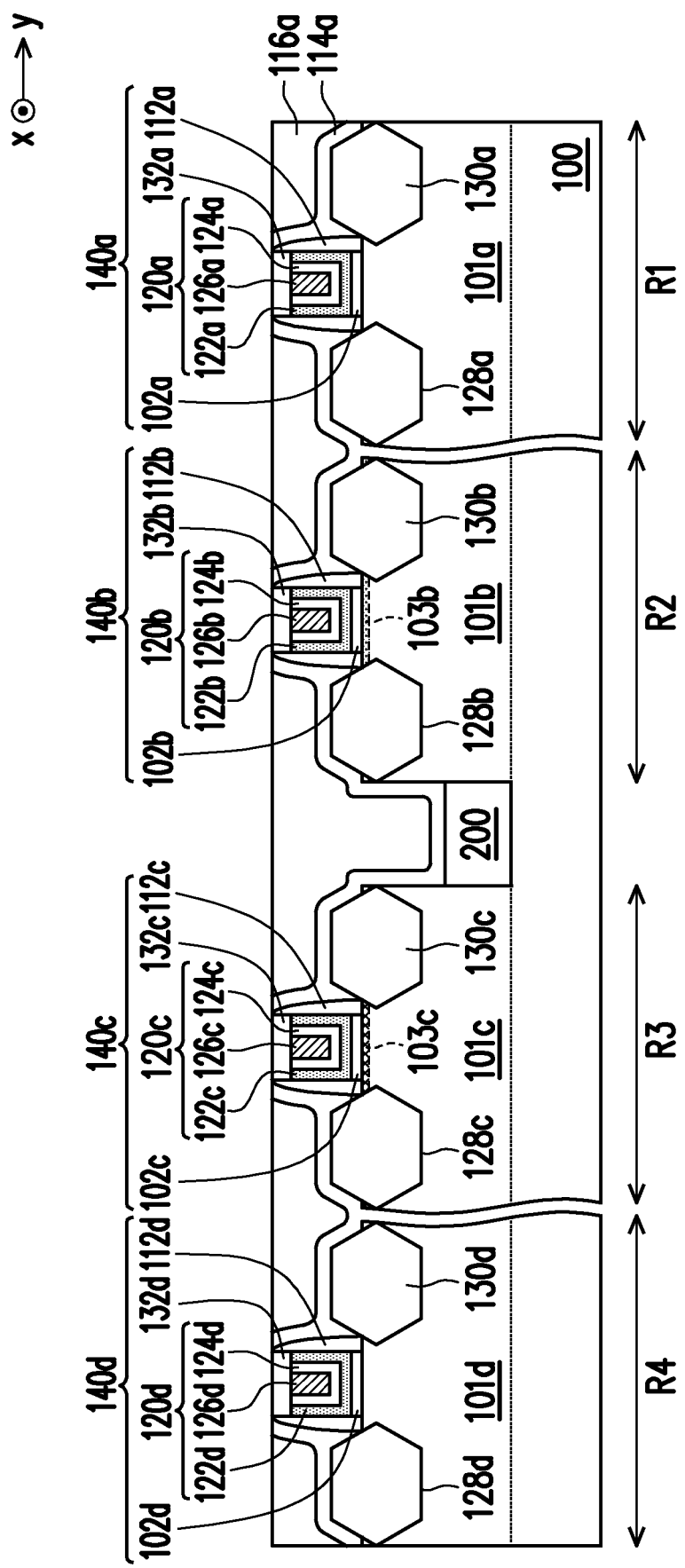

At Step S26 in FIG. 1 and as shown in and FIG. 2F, the gate electrodes 120a, 120b, 120c and 120d are partially removed by performing an etching process so as to form recesses (not shown). Thereafter, the caps 132a, 132b, 132c and 132d are filled in the recesses. In some embodiments, the caps 132a, 132b, 132c and 132d include silicon nitride, carbon-doped silicon nitride, or a combination thereof. In some embodiments, the caps 132a, 132b, 132c and 132d are formed by performing a deposition process using CVD, high density plasma (HDP) CVD, sub-atmospheric CVD (SACVD), molecular layer deposition (MLD), or other suitable methods, and performing a CMP process.

As shown in and FIG. 2F, as a result, the gate stacks 140a, 140b, 140c and 140d are formed across the semiconductor fins 101a, 101b, 101c and 101d respectively. The gate stack 140a includes the gate dielectric layer 102a, the gate electrode 120a, the cap 132a and the spacer 112a. The gate electrode 120a includes the work function layer 122a, the filter layer 124a and the metal filling layer 126a. It should be noted that the details described below with respect to the elements of the gate stack 140a may also apply to the elements of the gate stacks 140b, 140c and 140d, and thus the description of the elements in the gate stacks 140b, 140c and 140d are omitted.

Figure 2G:
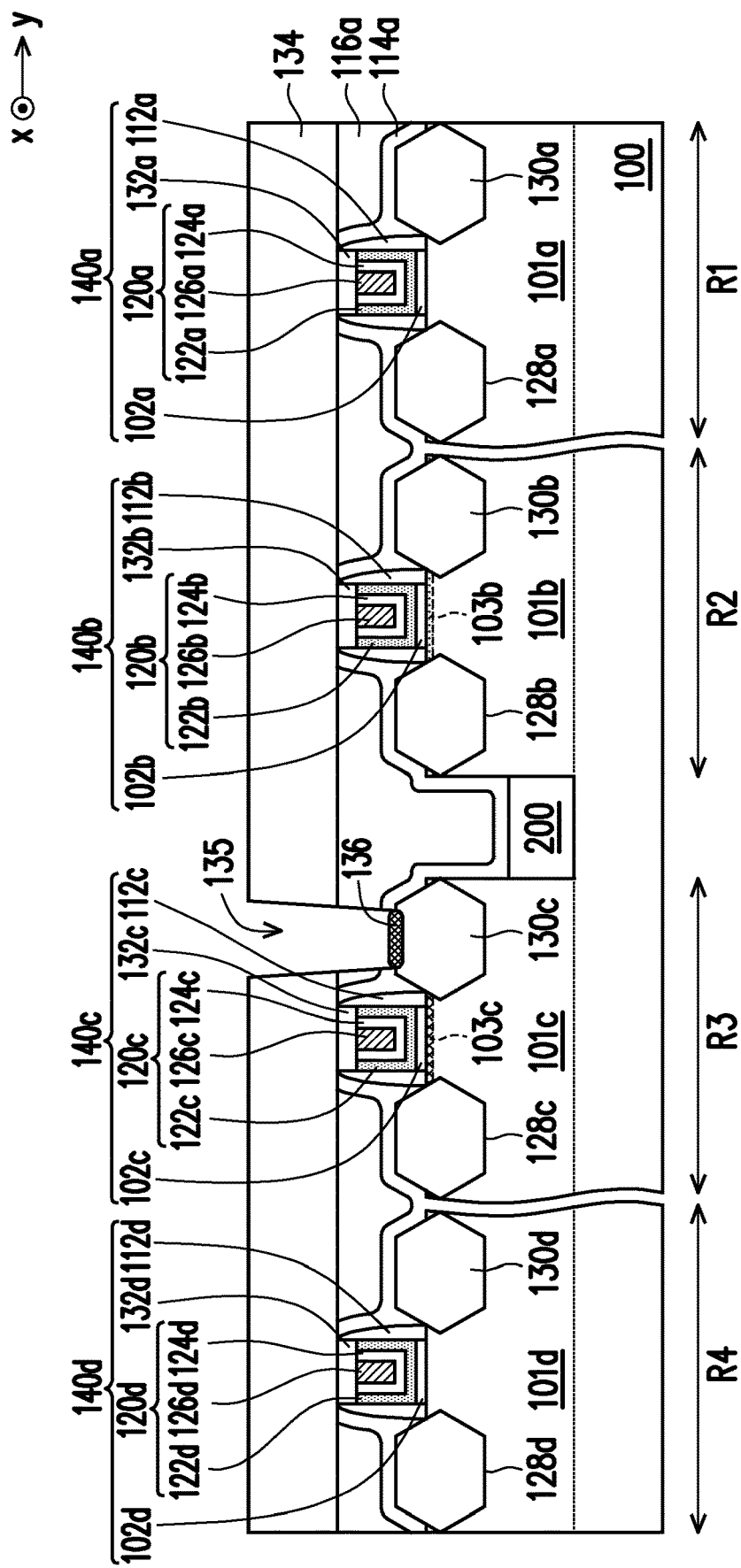

At Steps S28 and S30 in FIG. 1 and as shown in and FIG. 2G, another dielectric layer 134 is formed over the substrate 100. A contact hole 135 is formed in the dielectric layer 134, the dielectric layer 116a and the etch stop layer 114a. In some embodiments, the contact hole 135 is formed by performing a photolithography process and an etching process. In some embodiments, the dielectric layer 134, 116a may include the same material and be formed by the same formation process, but the present disclosure is not limited thereto. The material and the formation process have been described in the foregoing paragraphs, and the details are not iterated herein.

At Step S32 in FIG. 1 and as shown in and FIG. 2G, silicide region 136 may be optionally formed on the strain layer 130c exposed by the contact hole 135 through a self-aligned silicide (salicide) process. The silicide region 136 includes titanium silicide, cobalt silicide, nickel silicide, platinum silicide, erbium silicide, or palladium silicide. In some embodiments, germanide regions may be optionally formed on the strain layer 130c by a self-aligned germanide process if the substrate 100 includes Ge. In some embodiments, the germanide regions include NiGe, PtGe, TiGe$_2$, CoGe$_2$, or PdGe. In some embodiments, the self-aligned silicide (salicide) process and the self-aligned germanide process include forming a metal layer, performing a first thermal process and removing a remained metal layer. In alternative embodiments, the self-aligned silicide (salicide) process and the self-aligned germanide process further include performing a second thermal process after the step of removing the remained metal layer. In some embodiments, the temperature of the first thermal process or/and the second thermal process may be selected or controlled to adjust the threshold voltage values of the uLVT p-type FinFET in the region R1, the SVT p-type FinFET in the region R2, the SVT n-type FinFET in the region R3 and the uLVT n-type FinFET in the region R4.

Figure 2H:
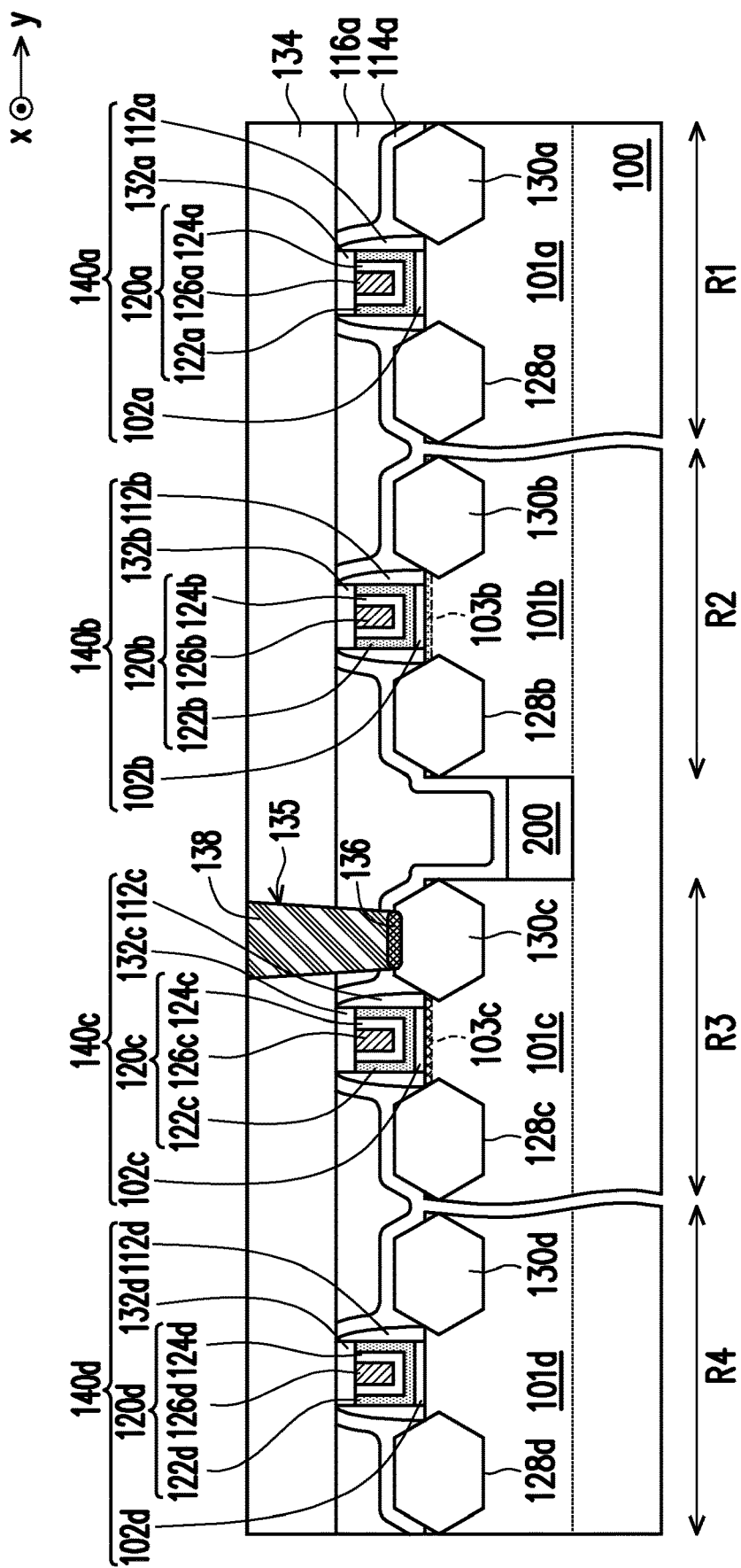

At Step S34 in FIG. 1 and as shown in and FIG. 2H, a conductive material (not shown) may be formed to fill in the contact hole 135, so as to form a contact 138. The conductive material may include a metal material or alloy, for example. In some embodiments, the metal material includes copper, copper alloys, aluminum, aluminum alloys, tungsten, or a combination thereof. In other embodiments, the contact 138 may include a liner layer, a seed layer, an adhesion layer, a barrier layer, etc. Then, a portion of the conductive material is removed by performing a CMP process to expose a top surface of the dielectric layer 134. In some embodiments, a top surface of the contact 138 is coplanar with the top surface of the dielectric layer 134.

In the above embodiment, the threshold voltage value of the uLVT p-type FinFET formed in the region R1 and the threshold voltage value of the uLVT n-type FinFET formed in the region R4 may be set by controlling or adjusting the thicknesses of the filter layers 124a and 124d or/and the temperature of the thermal process performed after the formation of the filter layers 124a and 124d. The threshold voltage value of the SVT p-type FinFET formed in the region R2 is first adjusted by the second implantation process, and further adjusted by controlling the thickness of the filter layer 124b or/and the temperature of the thermal process performed after the formation of the filter layer 124b. The threshold voltage value of the SVT n-type FinFET formed in the region R3 is first adjusted by the first implantation process, and further adjusted by controlling the thickness of the filter layer 124c or/and the temperature of the thermal process performed after the formation of filter layer 124c.

Figure 3A:
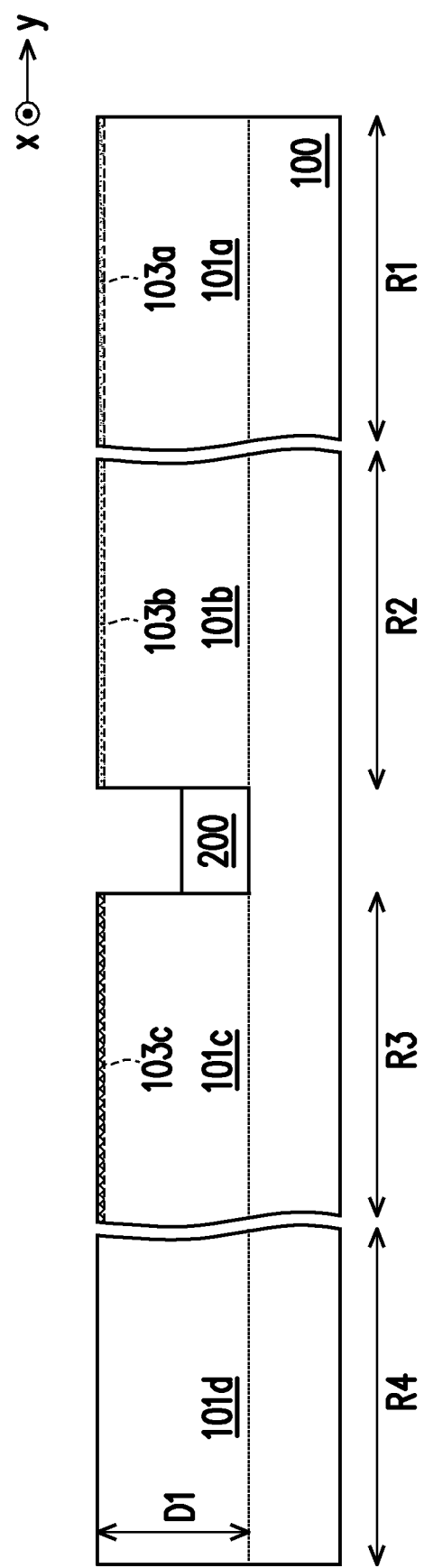
FIG. 3A to 3B are cross-sectional views of a method for fabricating a semiconductor device in accordance with alternative embodiments.
Figure 3B:
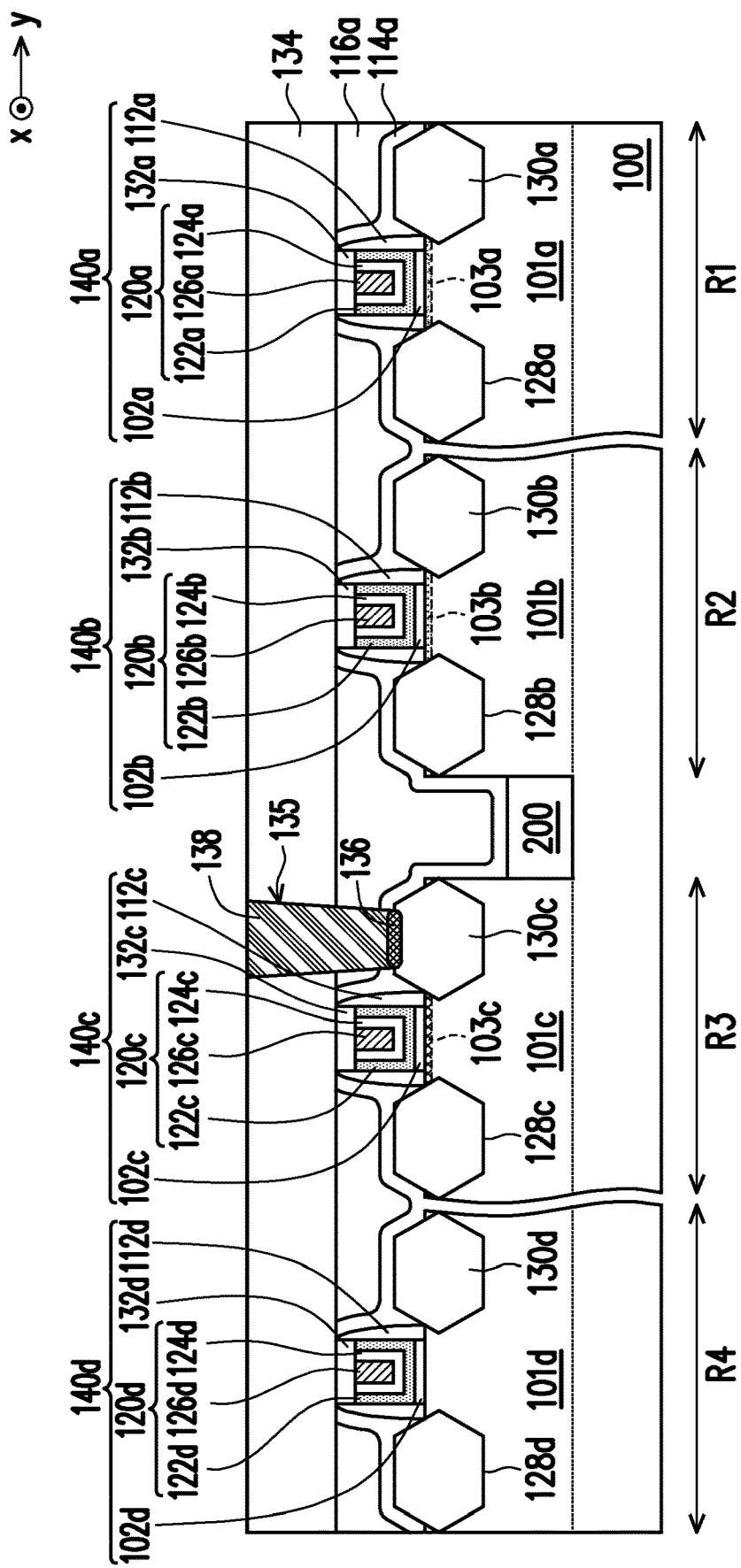

FIG. 3A to 3B are cross-sectional views of a method for fabricating a semiconductor device in accordance with alternative embodiments.

At Step S12 in FIG. 1 and as shown in FIG. 2A, in the above embodiment, the ion implantation processes for the threshold voltage values adjustment include the first implantation process and the second implantation process. However, as shown in FIG. 3A, in alternative embodiments, the ion implantation processes include the first implantation process, the second implantation process and a third implantation process. The third implantation process is performed so as to form a doped region 103a in the surface of the semiconductor fin 101a. In some embodiments, the doped region 103a is doped with p-type dopants, such as boron or BF$_2^+$. In other words, the threshold voltage value of the uLVT p-type FinFET to be formed in the region R1 is adjusted by the third implantation process first, the threshold voltage value of the SVT p-type FinFET to be formed in the region R2 is adjusted by the second implantation process first, and the threshold voltage value of the SVT n-type FinFET to be formed in the region R3 is also adjusted by the first implantation process first.

As shown in FIG. 3B, similarly, the threshold voltage values of the uLVT p-type FinFET, the SVT p-type FinFET, the SVT n-type FinFET, and the uLVT n-type FinFET may be adjusted by controlling the thicknesses of the filter layers 124a, 124b, 124c and 124d or/and the temperature of the thermal process performed after the formation of the filters 124b124a, 124b, 124c and 124d.

In other words, in the embodiments, the threshold voltage value of the uLVT p-type FinFET in the region R1 is first adjusted by the third implantation process, and then adjusted by controlling or adjusting the thickness of the filter layer 124a or/and the temperature of the thermal process performed after the formation of the filter layer 124a. The threshold voltage value of the SVT p-type FinFET in the region R2 is first adjusted by the second implantation process, and then adjusted by controlling the thickness of the filter layer 124b or/and the temperature of the thermal process performed after the formation of the filter layer 124b. The threshold voltage value of the SVT n-type FinFET in the region R3 is first adjusted by the first implantation process, and then adjusted by controlling the thickness of the filter layer 124c or/and the temperature of the thermal process performed after the formation of filter layer 124c. The threshold voltage value of the uLVT n-type FinFET formed in the region R4 is set by controlling or adjusting the thickness of the filter layer 124d or/and the temperature of the thermal process performed after the formation of the filter layer 124d.

In the embodiments of the disclosure, the filter layer is formed between the work function layer and the metal filling layer, and is used to avoid or decrease penetration of diffusion atoms (such as W, F or O) from the work function layer to the metal filling layer, or from the metal filling layer to the work function layer. As a result, the issue of threshold voltage shift may be prevented or decreased. Furthermore, in some embodiments, the threshold voltage value of the FinFET is adjusted by performing an ion implantation process and controlling the thickness of the filter layer or/and the temperature of the thermal process performed after the formation of the filter layer. In alternative embodiments, the threshold voltage value of a FinFET is adjusted by controlling the thickness of the filter layer or/and the temperature of the thermal process performed after the formation of the filter layer. In other words, the threshold voltage value of a FinFET can be adjusted by the described method without applying a conventional ion implantation process.

In accordance with some embodiments of the present disclosure, a semiconductor device includes a substrate, a first transistor, and a second transistor. The first transistor is disposed on the substrate within a first region and includes a first gate electrode. The first gate electrode includes a first filter layer between and in contact with a first conductive layer and a second conductive layer. The second transistor is disposed on the substrate within a second region and includes a second gate electrode. The second gate electrode includes a second filter layer between and in contact with a third conductive layer and a fourth conductive layer. The first transistor and the second transistor have a same conductive type, a first threshold voltage of the first transistor is lower than a second threshold voltage of the second transistor, and a first thickness of the first filter layer is larger than a second thickness of the second filter layer.

In accordance with alternative embodiments of the present disclosure, a semiconductor device includes a substrate, a first n-type transistor, a second n-type transistor, a first p-type transistor and a second p-type transistor on the substrate. The first n-type transistor has a first threshold voltage, and includes a first gate electrode including a first filter layer between and contacting a first work function layer and a first conductive layer, first source/drain (S/D) regions in the substrate and on sides of the first gate electrode, and a first doped region in a surface of the substrate and between the first S/D regions. The first doped region includes an n-type dopant. The second n-type transistor has a second threshold voltage lower than the first threshold voltage of the first n-type transistor. The second n-type transistor includes a second gate electrode including a second filter layer between and contacting a second work function layer and a second conductive layer, and second S/D regions in the substrate and on sides of the second gate electrode. The first p-type transistor has a third threshold voltage and includes a third gate electrode including a third filter layer between and contacting a third work function layer and a third conductive layer, third S/D regions in the substrate and on sides of the third gate electrode, and a second doped region in a surface of the substrate and between the third S/D regions, wherein the second doped region comprises a p-type dopant. The second p-type transistor has a fourth threshold voltage lower than the third threshold voltage of the first p-type transistor. The second p-type transistor includes a fourth gate electrode including a fourth filter layer between and contacting a fourth work function layer and a fourth conductive layer, and fourth S/D regions in the substrate and on sides of the fourth gate electrode.

In accordance with some embodiments of the present disclosure, a method of forming a semiconductor device includes the following processes: providing a substrate; performing a first implantation process on the substrate within a first region to form a n-type doped region in a surface of the substrate within the first region; forming a standard threshold voltage (SVT) n-type transistor on the substrate within the first region, comprising: forming a first gate electrode on the substrate, wherein the first gate electrode comprises a first filter layer between and contacting a first work function layer and a first conductive layer; forming a ultra-low threshold voltage (uLVT)n-type transistor on the substrate within a second region, comprising: forming a second gate electrode on the substrate, wherein the second gate electrode comprises a second filter layer between and contacting a second work function layer and a second conductive layer, wherein the second filter layer is formed to be thicker than the first filter layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
a substrate;
a first transistor, disposed on the substrate within a first region, comprising:
a first gate electrode, comprising a first filter layer between and in contact with a first conductive layer and a second conductive layer; and
a second transistor, disposed on the substrate within a second region, comprising:
a second gate electrode, comprising a second filter layer between and in contact with a third conductive layer and a fourth conductive layer,
wherein the first transistor and the second transistor have a same conductive type, a first threshold voltage of the first transistor is lower than a second threshold voltage of the second transistor, and a first thickness of the first filter layer is larger than a second thickness of the second filter layer.

2. The semiconductor device of claim 1, wherein the first filter layer, the first conductive layer, the second filter layer and the third conductive layer comprise a same material.

3. The semiconductor device of claim 1, wherein the first filter layer and the second filter layer comprise a same material, and materials of the first conductive layer and the third conductive layer are different from materials of the first filter layer and the second filter layer.

4. The semiconductor device of claim 1, wherein the first filter layer and the second filter layer comprise TiN—$Si_3N_4$ composite (TSN).

5. The semiconductor device of claim 1, wherein the first transistor and the second transistor are n-type transistors, the first conductive layer and the third conductive layer are work function layers.

6. The semiconductor device of claim 1, wherein the second transistor further comprises a doped region in a top surface of the substrate in the second region and underlying the second gate electrode, a conductive type of the doped region is the same as the conductive type of the second transistor, and the first transistor is free of the doped region in a top surface of the substrate in the first region and underlying the first gate electrode.

7. The semiconductor device of claim 6, wherein the second transistor further comprises spacers on sidewalls of the second gate electrode, and a portion of the doped region extends to below the spacers.

8. The semiconductor device of claim 1, wherein the first transistor further comprises a first cap covering top surfaces of the first conductive layer, the first filter layer and the second conductive layer, the second transistor further comprises a second cap covering top surfaces of the third conductive layer, the second filter layer and the fourth conductive layer.

9. A semiconductor device, comprising:
a substrate,
a first n-type transistor having a first threshold voltage on the substrate, comprising:
a first gate electrode, comprising a first filter layer between and contacting a first work function layer and a first conductive layer,
first source/drain (S/D) regions, in the substrate and on sides of the first gate electrode, and
a first doped region in a surface of the substrate and between the first S/D regions, wherein the first doped region comprises a n-type dopant;
a second n-type transistor having a second threshold voltage lower than the first threshold voltage of the first n-type transistor on the substrate, comprising:
a second gate electrode, comprising a second filter layer between and contacting a second work function layer and a second conductive layer; and
second source/drain (S/D) regions, in the substrate and on sides of the second gate electrode,
a first p-type transistor having a third threshold voltage on the substrate, comprising:
a third gate electrode, comprising a third filter layer between and contacting a third work function layer and a third conductive layer,
third source/drain (S/D) regions, in the substrate and on sides of the third gate electrode, and
a second doped region in a surface of the substrate and between the third S/D regions, wherein the second doped region comprises a p-type dopant; and
a second p-type transistor having a fourth threshold voltage lower than the third threshold voltage of the first p-type transistor on the substrate, comprising:
a fourth gate electrode, comprising a fourth filter layer between and contacting a fourth work function layer and a fourth conductive layer; and
fourth source/drain (S/D) regions, in the substrate and on sides of the fourth gate electrode.

10. The semiconductor device of claim 9, wherein the second n-type transistor is free of a doped region comprising n-type dopant in a surface of the substrate and between the second S/D regions.

11. The semiconductor device of claim 9, wherein the second p-type transistor is free of a doped region comprising p-type dopant in a surface of the substrate and between the fourth S/D regions.

12. The semiconductor device of claim 9, wherein the second p-type transistor further comprises a third doped region in a surface of the substrate and between the fourth S/D regions, and the third doped region comprises a p-type dopant.

13. The semiconductor device of claim 9, wherein the first filter layer, the second filter layer, the third filter layer and the fourth filter layer comprise a material the same as materials of the third work function layer and the fourth work function layer and different form materials of the first work function layer and the second work function layer.

14. The semiconductor device of claim 9, wherein a thickness difference between the first filter layer of the first n-type transistor and the second filter layer of the second n-type transistor is the same as a thickness difference between the third filter layer of the first p-type transistor and the fourth filter layer of the second p-type transistor, while a threshold voltage difference between the first n-type transistor and the second n-type transistor is larger than a threshold voltage difference between the first p-type transistor and the second p-type transistor.

15. The semiconductor device of claim 9, wherein
the first n-type transistor further comprises a first spacer on sidewalls of the first gate electrode, and a portion of the first doped region is underlying the first spacer; and
the first p-type transistor further comprises a second spacer on sidewalls of the third gate electrode, and a portion of the second doped region is underlying the second spacer.

16. A method of forming a semiconductor device, comprising:
providing a substrate;
performing a first implantation process on the substrate within a first region to form a n-type doped region in a surface of the substrate within the first region;
forming a standard threshold voltage (SVT) n-type transistor on the substrate within the first region, comprising:
forming a first gate electrode on the substrate, wherein the first gate electrode comprises a first filter layer between and contacting a first work function layer and a first conductive layer;
forming an ultra-low threshold voltage (uLVT) n-type transistor on the substrate within a second region, comprising:
forming a second gate electrode on the substrate, wherein the second gate electrode comprises a second filter layer between and contacting a second work function layer and a second conductive layer, wherein the second filter layer is formed to be thicker than the first filter layer.

17. The method of claim 16, wherein the first implantation process is performed to adjust a first threshold voltage value of the SVT n-type transistor, and the first threshold voltage value is further adjusted by controlling a thickness of the first filter layer.

18. The method of claim 16, further comprising:
performing a second implantation process on the substrate within a third region to form a first p-type doped region in a surface of the substrate within the third region,
forming a SVT p-type transistor on the substrate within the third region, comprising:
forming a third gate electrode on the substrate, wherein the third gate electrode comprises a third filter layer between and contacting a third work function layer and a third conductive layer; and
forming an uLVT p-type transistor on the substrate within a fourth region, comprising
forming a fourth gate electrode on the substrate, wherein the fourth gate electrode comprises a fourth filter layer between and contacting a fourth work function layer and a fourth conductive layer,
wherein the second implantation process is performed to adjust a third threshold voltage of the SVT p-type transistor, and the third threshold voltage is further adjusted by controlling a thickness of the third filter layer.

19. The method of claim 18, wherein before forming the uLVT p-type transistor, further comprising: performing a third implantation process on the substrate within the fourth region to form a second p-type doped region in a surface of the substrate within the fourth region, wherein the third implantation process is performed to adjust a fourth threshold voltage of the uLVT p-type transistor, and the fourth threshold voltage is further adjusted by controlling a thickness of the fourth filter layer.

20. The method of claim 18, wherein a thickness difference between the first filter layer of the SVT n-type transistor and the second filter layer of the uLVT n-type transistor is the same as a thickness difference between the third filter layer of the SVT p-type transistor and the fourth filter layer of the uLVT p-type transistor, and a threshold voltage difference between the SVT n-type transistor and the uLVT n-type transistor is larger than a threshold voltage difference between the SVT p-type transistor and the uLVT p-type transistor.

* * * * *